(12) United States Patent
Papadas

(10) Patent No.: US 6,218,700 B1
(45) Date of Patent: Apr. 17, 2001

(54) REMANENT MEMORY DEVICE

(75) Inventor: Constantin Papadas, Gieres (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/181,432

(22) Filed: Oct. 28, 1998

(30) Foreign Application Priority Data

Oct. 29, 1997 (FR) .................................................. 97 13805

(51) Int. Cl.$^7$ ................................................ H01L 29/792
(52) U.S. Cl. .......................... 257/324; 257/325; 257/405; 257/411
(58) Field of Search .................................. 257/324, 325, 257/405, 410, 411

(56) References Cited

U.S. PATENT DOCUMENTS

| 5,286,994 | 2/1994 | Ozawa et al. | 257/411 |
| 5,291,048 | * 3/1994 | Nakao | 257/325 |
| 5,319,229 | 6/1994 | Shimoji et al. | 257/324 |
| 5,319,230 | 6/1994 | Nakao | 257/325 |
| 5,604,357 | 2/1997 | Hori | 257/24 |
| 5,661,056 | 8/1997 | Takeuchi | 438/261 |

FOREIGN PATENT DOCUMENTS 55-087490   7/1980   (JP) .

* cited by examiner

*Primary Examiner*—Eddie C. Lee
*Assistant Examiner*—George C. Eckert, II
(74) *Attorney, Agent, or Firm*—Theodore E. Galanthay; Robert Iannucci; Seed IP Law Group, PLLC

(57) ABSTRACT

A remanent, electrically programmable and erasable, memory device comprises of a MOS type transistor whose gate insulator contains charged mobile species is disclosed. The gate insulator is comprised transversely of a sandwich comprising at least five areas. Two intermediate areas have first band-gap values, and two endmost and a central areas have band gap values greater than the first values.

18 Claims, 2 Drawing Sheets

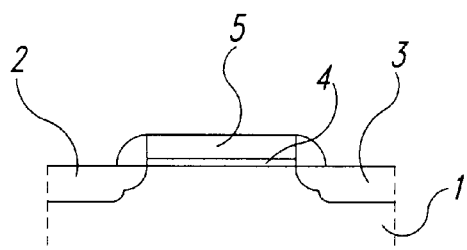
Fig. 1
*(Prior Art)*
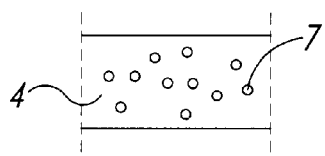 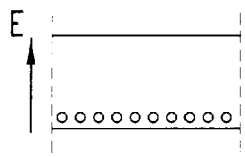 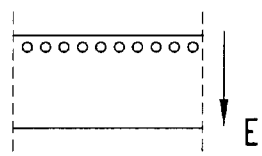
Fig. 2A  Fig. 2B  Fig. 2C
*(Prior Art)*  *(Prior Art)*  *(Prior Art)*
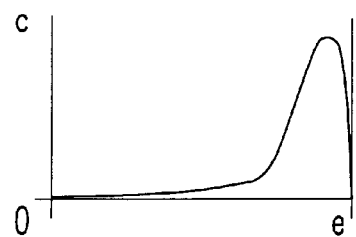
Fig. 3
*(Prior Art)*

US 6,218,700 B1

REMANENT MEMORY DEVICE

TECHNICAL FIELD

The present invention relates to a remanent, electrically erasable and programmable memory device.

BACKGROUND OF THE INVENTION

Known remanent, electrically erasable and programmable memory devices, include memory devices of MNOS type and double-gate memory devices. The MNOS memory devices have the drawback of having a limited remanence duration. The double-gate memory devices have the drawback of being relatively complex to manufacture and of not being compatible with standard CMOS component manufacturing processes.

SUMMARY OF THE INVENTION

Thus, the present invention provides a new type of memory device realized in MOS technology and having a simple structure. This structure allows the memory device to have a long remanence.

The present invention also provides a memory device in which the programming and erasing operations do not need a high voltage with respect to the normal operating voltage of a conventional CMOS circuit. Additionally, the memory device according to the invention has minimum dimensions.

To achieve this, the present invention provides a remanent, electrically programmable and erasable, memory device comprised of a MOS type transistor whose gate insulator contains charged mobile species. The gate insulator is comprised transversely of a sandwich comprising at least five areas, among which intermediate areas have first bandgap values, and endmost and central areas have band gap values greater than the first values.

According to an embodiment of the invention, the intermediate areas are made of the same material.

According to an embodiment of the invention, the endmost and central areas are made of the same material.

According to an embodiment of the invention, the endmost areas have a thickness substantially equal to the minimum thickness at which no tunnel effect occurs.

According to an embodiment of the invention, the endmost and central areas are silicon oxide layers and the intermediate areas are silicon nitride layers.

The foregoing and other features, aspects and advantages of the invention will become apparent from the following detailed description of embodiments, given by way of illustration and not of limitation with reference to the accompanying drawings.

BRIEF DESCRIPTION OF THE DRAWINGS

FIG. 1 shows an outline of a conventional MOS transistor.

FIGS. 2A, 2B and 2C show magnified views of an insulating layer at various bias states.

FIG. 3 shows a concentration of mobile species as a function of the thickness, after biasing.

DETAILED DESCRIPTION OF THE INVENTION

Figure 4:
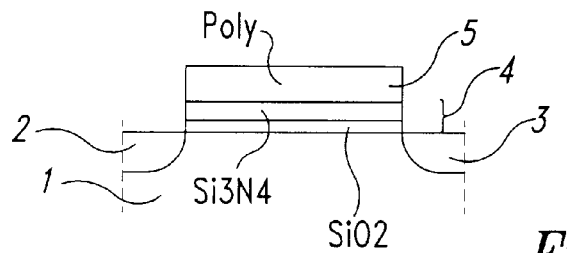
FIG. 4 shows an MNOS type structure.

FIG. 1 shows a cross-sectional view of a conventional MOS transistor comprising a substrate 1, a source region 2, a drain region 3, a gate insulating layer 4 and a gate conducting layer 5. Commonly, the substrate is silicon, the insulating layer is a silicon oxide and the gate conducting layer is doped polysilicon. A known defect of gate insulating layer 4 is that it is likely to contain contaminating ions resulting from the fabrication process, for example alkaline ions. Thus, great care is usually taken to avoid the introduction of such defects during the fabrication or the maturation of the components, since these alkaline ions are likely to be introduced into the gate insulating layer by migration through other adjacent layers.

The effect of the presence of these alkaline ions is illustrated in FIGS. 2A to 2C. FIG. 2A shows a gate insulating layer 4 in which alkaline ions 7 are present and distributed randomly. If a positive field E is applied to the gate insulating layer, for example by positively biasing the gate with respect to the substrate, the alkaline ions will tend to gather near the substrate, such as shown in FIG. 2B. In case of a reverse biasing, the alkaline ions will tend to gather near the gate as shown in FIG. 2C. These displacements of alkaline ions, which may in fact simply be caused by the operation of the MOS transistor, of course affects its characteristics, especially its threshold voltage. In a worst case, a normally conducting transistor may become a normally non-conducting transistor or vice-versa.

It has been imagined in the art to use this disturbing phenomenon to impart a memory effect to the MOS transistor. For this purpose, mobile charges have voluntarily been introduced in gate insulating layers, for example hydrogen or deuterium ions. It is then conceivable that the two states illustrated in FIGS. 2B and 2C correspond to two memory states which may be recognized by a reading. This type of memory has not achieved a great success because it suffers from reliability defects and limited remanence.

As an example, FIG. 3 shows a curve of the mobile species concentration c as a function of the relative location e of the insulating layer. After a programming operation brings the charges at the bottom of the insulating layer, the distribution of the charge carriers is substantially that as illustrated in FIG. 3. However, this state is not fundamentally stable for the following reasons.

First, under the effect of natural relaxations and disturbances due to repeated readings of the system, the charge distribution tends to equalize. The memory state then disappears. A periodic refreshing must thus be provided.

Second, another problem is due to recombination phenomena. Charged species are inevitably very close to the interface with an adjacent layer (the substrate or the gate). If they are within a distance from the interface at which a tunnel effect may occur, these charges may recombine with free carriers present at the other side of the interface. Thus, in time, the number of active ions of the memory phenomenon tends to decrease and the memory inevitably becomes inoperative or in any case has thresholds which become less distinctly differentiable.

FIG. 4 shows another MOS type structure having a memory effect, in which the gate insulator is formed of a silicon nitride layer (on the gate side) and of a silicon oxide layer (on the substrate side). This so-called MNOS memory operates by injection, at each programming, of electrons or holes which come at the interface between silicon nitride and silicon oxide. This is also a low remanence memory, the electrons and the holes being very likely to recombine or to be distributed by relaxation. Moreover, as will be seen hereafter, the electrons or the holes are likely to be trapped at intermediate levels and not be localized accurately.

The present invention provides a new memory device structure in which the two states are distinctly differentiable and stable in time.

Figure 5:
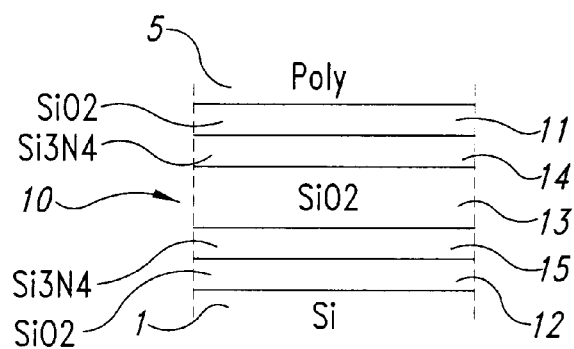
FIG. 5 shows an exemplary gate insulating structure of a memory device according to the present invention.

This memory device has a MOS transistor structure in which the gate insulator is comprised of a sandwich such as shown in FIG. 5. This sandwich includes two endmost layers or areas 11 and 12, a median layer or area 13 and intermediate layers or areas 14 and 15.

Figure 6:
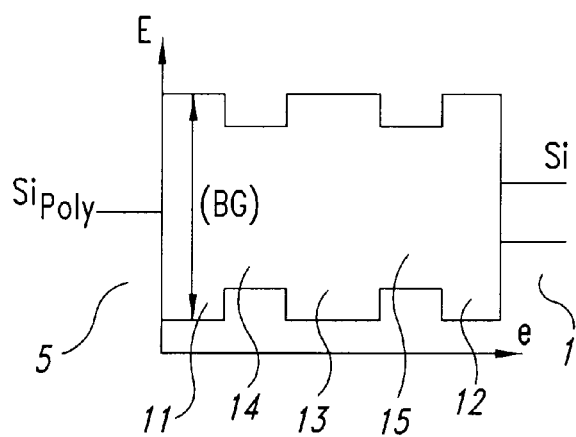
FIG. 6 shows a relative energy diagram of the structure of FIG. 5.

These various layers or areas should, according to the invention, have characteristics such as illustrated in FIG. 6 which shows a relative energy diagram as a function of the thickness. The distance between two horizontal lines of same abscissa corresponding to a given area defines the band-gap width (BG) of the material in the corresponding area. Thus, the endmost areas 11 and 12 and the median area 13 are chosen such that they have a band-gap width greater than the band-gap width of the material constituting the intermediate areas 14 and 15. It was considered, in the left portion of the figure, that the polysilicon was perfectly conductive and that its mobile charges were situated in its conduction band and, in the right portion of the figure, that the silicon of the substrate had a low height band-gap, which is characteristic of a semiconductor with respect to an insulator.

Thus, for the charged mobile species (alkaline ions, hydrogen ions, deuterium ions or others) present in insulator 10, there are two stable areas, corresponding to areas 14 and 15, which constitute voltage wells delimited by voltage barriers. By applying a sufficient electric field of positive or negative polarity, it is possible to bring the mobile charges to either one of these two areas. Once they are in one of these areas, the mobile charges can no longer exit them without applying, to the insulator, a field such that the charges cross the voltage barrier allowing them to go from area 14 to area 15 or inversely.

The endmost areas 11 and 12 are chosen with a sufficient thickness for preventing any recombination of the mobile charges contained in the adjacent well, with the free charges present in the semiconductor and thus avoiding the disappearing of the charges by recombination. In other words, this thickness is such that no tunnel effect will occur through the considered area. The thickness of the central area 13 will of course be larger than this threshold value, and will preferentially be clearly larger for clearly differentiating the two memory states.

It will be noted that the present invention makes use of a system in which the charges exist in the insulator, in contrast to the case of MNOS structures. Moreover, the charges are of ionic type and not electrons or holes. This is fundamental because, for electrons and holes, there would be trapping areas at the central layer or the endmost layers and the electrons and the holes would not wholly localize inside the voltage wells constituted by areas 14 and 15.

As an example of a structure satisfying the definition of the present invention, the endmost layers 11 and 12 may be implemented as silicon oxide layers of a thickness greater than 3 to 4 mn (30 to 40 angstroms), the tunnel effect being only revealed for thicknesses smaller than approximately 30 angstroms. The central layer 13 may be a silicon oxide layer of a thickness greater than 30 angstroms. It may be substantially thicker if it is desired to clearly differentiate the two states, at the cost of an increase of the programming voltage for making the free charges pass from one state to the other. Each of the intermediate layers may have a thickness of substantially 30 to 40 angstroms. Again, the maximum value of these thicknesses is not limited by physical considerations but only by the desire to better define each of the memory states. This system conveniently satisfies the requirements of the invention, silicon oxide having a band-gap of about 11 electron-volts whereas silicon nitride has a band-gap of about 8 electron-volts. Other systems may be selected, for example $SiO_2$-$Ta_2O_5$, $SiO_2$-$TiO_2$, etc. One could also select a single insulating layer, the state of which is locally modified in two areas of its thickness, for example a silicon oxide layer having intermediate areas modified by nitrogen and silicon implantation.

To achieve a programming bringing the charges near the substrate, the gate may be connected to a positive voltage while the substrate, the drain and the source are connected to ground. Conversely, for achieving a programming in which the mobile charges are brought near the gate, a positive voltage will be applied to the substrate, the drain and the source and the gate will be connected to the ground voltage. Of course, this corresponds to the case where the mobile species are positive ions. All of what has been described previously may be reversed in the case where the mobile species are negative ions.

Preferably, one will select the size of the central layer and materials with suitable band-gaps so that the voltage for making the mobile charges pass from one voltage well to the other is, for example, of around 4 volts for a device intended to be read operated at a voltage of about 2 volts, so that the reading is not likely to modify the programming.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A remanent, electrically programmable and erasable memory device, comprising a MOS type transistor having a gate insulator that permanently contains charged mobile species, wherein the insulator is formed transversely of a sandwich comprising at least five areas:

first and second intermediate areas having first band-gap values, and first and second endmost areas and a central area having band gap values greater than the first values.

2. The memory device according to claim 1 wherein the intermediate areas are formed of a same material.

3. The memory device according to claim 1 wherein the endmost and central areas are formed of a same material.

4. The memory device according to claim 1 wherein the endmost areas have a thickness substantially equal to the minimum thickness at which no tunnel effect occurs.

5. The memory device according to claim 1 wherein the endmost and central areas are silicon oxide layers and the intermediate areas are silicon nitride layers.

6. The memory device of claim 1 wherein the charged mobile species are ions.

7. The memory device of claim 1 wherein the thickness of each of the first and second endmost areas layer is greater than or equal to 30 angstroms.

8. An electrically programmable and erasable memory device comprising:

a substrate, including source and drain regions;

a first end insulating layer over the substrate, the first end insulating layer having a first bandgap;

a first intermediate insulating layer over the first end insulating layer, the first intermediate insulating layer having a second bandgap;

a center insulating layer over the first intermediate insulating layer, the center insulating layer having the first bandgap;

a second intermediate insulating layer over the center insulating layer, the second intermediate insulating layer having the second bandgap;

a second end insulating layer over the second intermediate insulating layer, the second end insulating layer having the first bandgap;

charged mobile ions present in at least one of the insulating layers; and a gate overlying the insulating layers.

9. The memory device of claim 8 wherein the first end, center, and second end insulating layers are made from the same material.

10. The memory device of claim 9 wherein the material is a silicon oxide.

11. The memory device of claim 8 wherein the first and second intermediate insulating layers are made from the same material.

12. The memory device of claim 11 wherein the material is a silicon nitride.

13. The memory device of claim 8 wherein the first bandgap is larger than the second bandgap.

14. The memory device of claim 8 wherein the first end, center, and second end insulating layers are thick enough to prevent tunneling.

15. The memory device of claim 8 wherein the thickness of the first end insulating layer is greater than or equal to 30 angstroms.

16. A memory device comprising:

a substrate, including source and drain regions;

a first insulating layer overlaying the substrate;

a second insulating layer positioned above the first insulating layer and permanently including charged mobile ions;

a third insulating layer positioned above the second insulating layer; and a gate layer overlying the third insulating layer, wherein the first insulating layer has a thickness that is greater than or equal to a minimum thickness needed to prevent tunneling between the second insulating layer and the substrate.

17. The memory device of claim 16, further comprising;

a fourth insulating layer positioned between the first and second insulating layers; and a fifth insulating layer positioned between the second and third insulating layers.

18. The memory device of claim 16 wherein the thickness of the first insulating layer is greater than or equal to 30 angstroms.

* * * * *